United States Patent [19]

Suzuki et al.

[11] Patent Number: 4,589,095
[45] Date of Patent: May 13, 1986

[54] MAGNETIC BUBBLE STRETCHER

[75] Inventors: Ryo Suzuki, Kodaira; Teruaki Takeuchi, Kokubunji; Masatoshi Takeshita; Naoki Kodama, both of Hachioji; Yutaka Sugita, Tokorozawa, all of Japan

[73] Assignee: Hitachi, Ltd., Tokyo, Japan

[21] Appl. No.: 636,741

[22] Filed: Aug. 1, 1984

[30] Foreign Application Priority Data

Aug. 3, 1983 [JP] Japan .................. 58-141228

[51] Int. Cl.⁴ .............................................. G11C 19/08
[52] U.S. Cl. .............................................. 365/43; 365/8
[58] Field of Search ........................... 365/43, 8

[56] References Cited

U.S. PATENT DOCUMENTS 4,349,892 9/1982 Suzuki et al. .................. 365/43
4,502,129 2/1985 Suzuki et al. .................. 365/8

FOREIGN PATENT DOCUMENTS 0060831 8/1973 Japan ............................ 365/8
0046381 3/1982 Japan ............................ 365/8
0041483 3/1983 Japan ............................ 365/8

*Primary Examiner*—James W. Moffitt
*Attorney, Agent, or Firm*—Antonelli, Terry & Wands

[57] ABSTRACT

A magnetic bubble stretcher comprises a bubble fanning part for propagating a magnetic bubble while gradually stretching the bubble and a bubble propagation part for propagating the stretcher bubble. The bubble fanning and propagation parts include a bubble propagation patterns as fundament elements for stretching or propagating the bubble the bubble propagation patterns in the bubble fanning part are different in shape and/or dimension from the bubble propagation patterns in the bubble propagation part.

10 Claims, 11 Drawing Figures

MAGNETIC BUBBLE STRETCHER

The present invention relates to means for stretching a magnetic bubble in a magnetic bubble device, and more particularly to a magnetic bubble stretcher in which a magnetic bubble can operate in a wide range of bias magnetic field.

In a magnetic bubble device, means for stretching a magnetic bubble (hereinafter simply referred to as "bubble") by a factor of several hundreds is an important technique having a close relationship to the detection of bubble, etc. Bubble stretching means is first disclosed in Japanese Patent Application Laid Open No. 48-60831 laid open on Aug. 25, 1973. The disclosed bubble stretcher has such a structure as shown in FIG. 1. Like a conventional bubble propagation pattern 2, a bubble stretcher 1 is formed of a multiplicity of chevron-shaped bubble propagation patterns 3 which can propagate a bubble. The bubble stretcher 1 includes fanning part 4 for stretching a bubble and a bubble propagation part 5 for propagating and detecting the stretched bubble. In the bubble fanning part 4, the number of bubble propagation patterns arranged in a direction perpendicular to a bubble propagation direction 6 indicated by an arrow is successively increased along the bubble propagation direction to form a fanlike arrangement of bubble propagation patterns. When a bubble is propagated through the bubble fanning part 4, the bubble is successively stretched in a direction perpendicular to the bubble propagation direction so as to form a string-shaped bubble. In the bubble propagation part 5, a plurality of pattern rows having the same number of bubble propagation patterns 3 in directions perpendicular to the bubble propagation direction are juxtaposed in the bubble propagation direction to form a rectangular arrangement of bubble propagation patterns. The bubble which has been stretched in the bubble fanning part 4, is propagated through the bubble propagation part 5 to a bubble detection part, as it is. Such a bubble stretcher, however, encounters a problem that, when a bias magnetic field is low, an error may occur in the bubble stretching operation, thereby deteriorating propagation characteristics. The occurrence of such an error is remarkable as the diameter of the bubble is smaller.

It is therefore an object of the present invention to provide a magnetic bubble stretcher which can eliminate an error associated with the stretching of bubble under a low bias field, thereby providing a sufficiently large bias field margin.

According to the present invention there is provided a magnetic bubble stretcher comprising a bubble fanning part for propagating a magnetic bubble while gradually stretching the bubble and a bubble propagation part for propagating the stretched bubble, wherein the shape and/or dimension of each of bubble propagation patterns included in said bubble fanning part is different from that of each of bubble propagation patterns included in said bubble propagation part.

The present invention will be apparent from the following detailed description taken in conjunction with the accompanying drawing, in which FIG. 1 is a schematic view showing the structure of a conventional magnetic bubble stretcher;

Prior to the description of preferred embodiments of the present invention, the error associated with the stretching of bubble, prior art approaches for preventing such an error, and the results of experiments made by the present inventors will be described referring to FIGS. 2 to 7.

Figure 1:
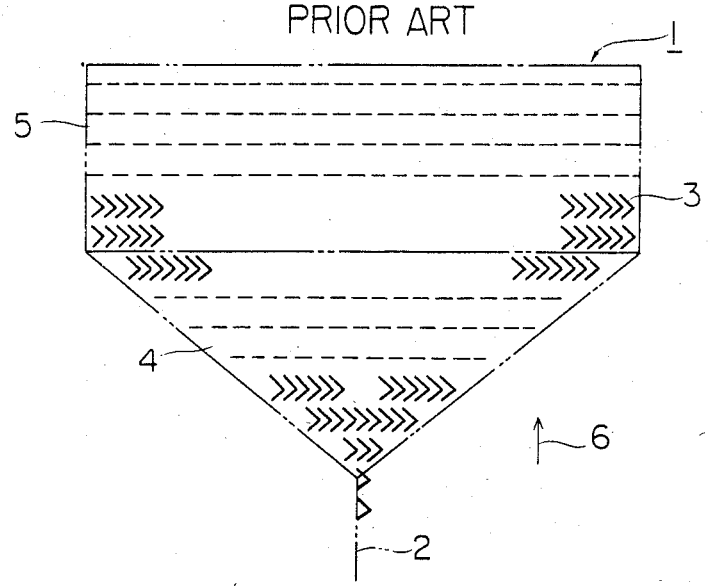
Figure 2:
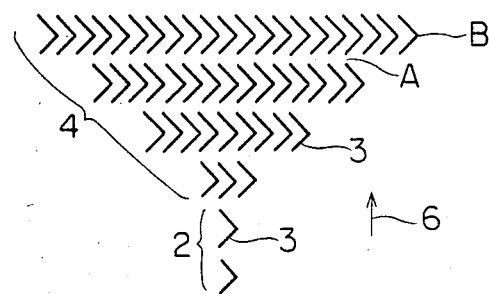
FIG. 2 is a detailed schematic view showing the entrance of the magnetic bubble stretcher shown in FIG. 1.

FIG. 2 schematically shows an entrance portion of the bubble stretcher 1 shown in FIG. 1 which is connected to the bubble propagation path 2. It is apparent from FIG. 2 that in a portion of the bubble fanning part there are bubble propagation patterns 3 in one row adjacent another bubble propagation pattern row in the bubble propagation direction 6 and the rows do not have the same extent so that adjacent patterns of the rows are hereinafter referred to as an overlapping propagation pattern region and where such patterns are non-adjacent are hereinafter referred to as a non-overlapping propagation pattern region.

Figure 3:
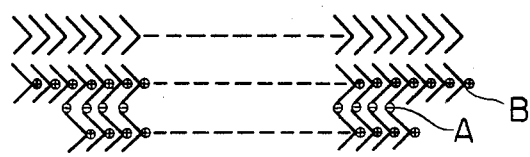
FIG. 3 is a schematic view showing magnetic poles produced at bubble propagation patterns which make up the bubble fanning part of the magnetic bubble stretcher.
Figure 4:
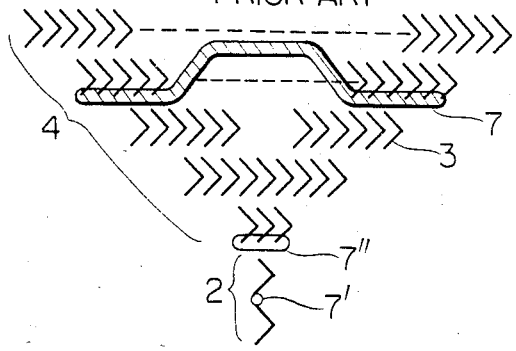
FIG. 4 is a schematic view for explaining an error taking place at the bubble fanning part.

Now, let consider the magnetized state of the pattern rows included in the bubble fanning part 4 when a bubble is propagated through a gap A between adjacent pattern rows from one row thereof to the apexes B of the bubble propagation patterns in the other pattern row. As shown in FIG. 3, negative magnetic poles indicated by symbol ⊖ and exerting a repulsive force on the bubble having a negative magnetic pole are generated at the upper ends of the propagation patterns in the one pattern row, while positive magnetic poles indicated by symbol ⊕ and exerting an attractive force on the bubble are generated at the apexes of the propagation patterns in other pattern row. Accordingly, in a region where bubble propagation patterns overlap each other in the bubble propagation direction, the bubble receives both of the repulsive force and the attractive force. On the other hand, in a region where bubble propagation patterns do not overlap each other in the bubble propagation direction, the bubble receives only the attractive force. Thus, a bubble propagating force in the overlapping propagation pattern region is far greater than that in the non-overlapping propagation pattern region. Therefore, as shown in FIG. 4, the propagation of a bubble 7 is delayed at the non-overlapping propagation pattern region so that the delayed portion of the bubble is attracted to the attractive magnetic poles of the preceding pattern row, thereby causing an error. In FIG. 4, reference numeral 7' designates a bubble on the ordinary bubble propagation path 2, and numeral 7" a linearly stretched bubble lying in close proximity to the entrance of the bubble fanning part 4.

Figure 5A:
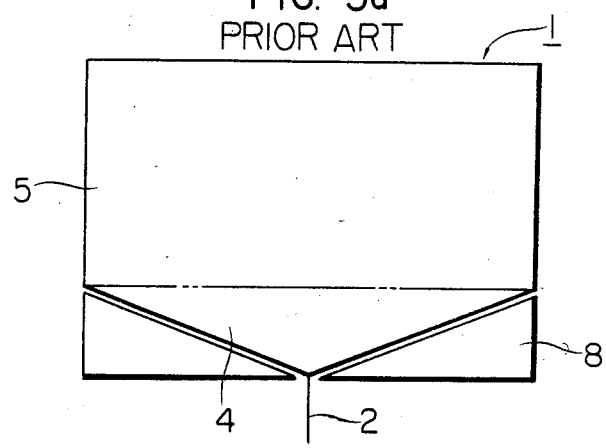
FIGS. 5a and 5b are schematic views showing the structure of an improved prior art magnetic bubble stretcher.

The error can be prevented by eliminating the non-overlapping propagation pattern region in the bubble fanning part. A method for eliminating the non-overlapping portion is disclosed in Japanese Patent Application Laid-Open No. 57-46381 laid open on Mar. 16, 1982. According to the disclosed method, as shown in FIG. 5a, a pair of triangular dummy bubble fanning parts 8 each having dummy bubble propagation patterns which do not contribute to the stretching of a bubble but serve as means for pushing out the bubble on the basis of the repulsive magnetic poles, are additionally provided in slightly spaced relation to the fanlike bubble fanning part 4 so that a rectangular arrangement of bubble propagation patterns is formed by the bubble fanning part 4 and the dummy parts 8. With this structure, since the greater part of bubble propagation patterns overlap each other in the bubble propagation direction, a margin of the bubble stretching operation can be greatly improved. However, as is apparent from an enlarged view shown in FIG. 5b, there still remains a small non-overlapping propagation pattern region. Therefore, the above-mentioned error may take place in such a region.

As has been explained in the above, the erroneous operation at the conventional magnetic bubble stretcher is due to the fact that a portion of the bubble is attracted to the respective apexes of some bubble propagation patterns included in the magnetic bubble stretcher. Accordingly, it is thought that the erroneous operation may be prevented by reducing the strength of bubble attracting magnetic poles which appear at the respective apexes of bubble propagation patterns icluded in the magnetic bubble stretcher. An improved method based upon such a thought is disclosed in Japanese Patent Application Laid-Open No. 58-41483 laid open to Mar. 10, 1983. In this method, three or more winding points are provided in the central portion of each of bubble propagation patterns included in a magnetic bubble stretcher. However, this structure encounters another trouble which will be explained below.

Figure 5B:
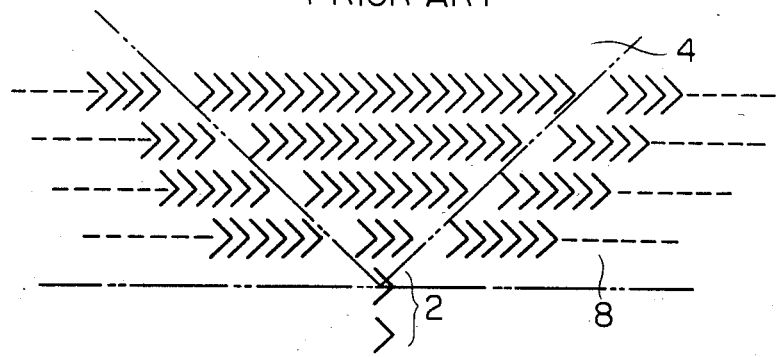
Figure 6:
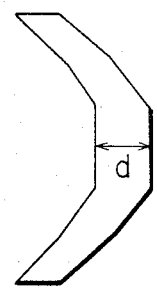
FIG. 6 is a plan view of a bubble propagation pattern for explaining magnetic bubble stretchers which has been experimentally fabricated by the present inventors.
Figure 7A:
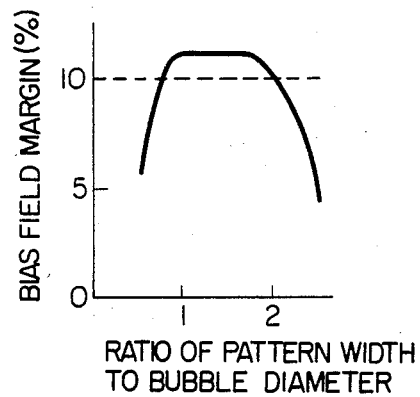
FIGS. 7a and 7b show bias field margins at the bubble fanning part and bubble propagation part of the experimentally fabricated magnetic bubble stretchers.
Figure 7B:
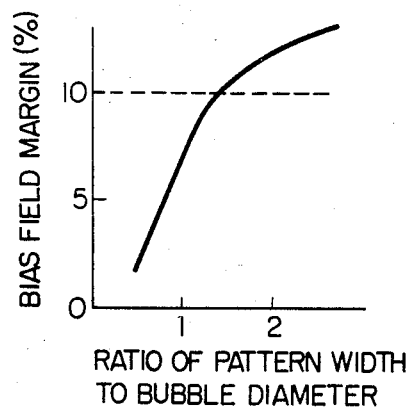

The present inventors have used bubble propagation patterns each having three or more winding points as shown in FIG. 6 to form a magnetic bubble stretcher having such an arrangement of bubble propagation patterns as shown in FIGS. 5a and 5b, and have experimentally studied the characteristics of several magnetic bubble stretchers thus formed having the bubble propagation pattern of different widths. FIGS. 7a and 7b show bias field margins at the fanlike bubble fanning part 4 and the rectangular bubble propagation part 5, respectively. As is apparent from FIG. 7a, at the fanlike bubble fanning part 4 a favorable characteristic is exhibited, even when the rotating magnetic field is weak, as long as a ratio of the propagation pattern width d in a direction perpendicular to the bubble propagation direction to the bubble diameter lies in a range of 0.8 to 2. On the other hand, at the rectangular bubble propagation part 5 where a plurality of pattern rows having the same length are arranged in the bubble propagation direction, the bias field margin decreases abruptly as the width d of bubble propagation pattern is small when a weak rotating field is used. This will be because the bubble attracting magnetic poles appearing at the apexes of bubble propagation patterns are weakened by reducing the width of bubble propagation pattern and thus a bubble stretching force becomes too weak to sufficiently stretch the bubble. It is to be noted that the characteristics of the bubble fanning part disposed at the entrance of the magnetic bubble stretcher are not deteriorated by the reduction of pattern width. Accordingly, in order to eliminate the erroneous operation arising at the entrance of the magnetic bubble stretcher, it is preferable to form the fanlike bubble fanning part 4 at the entrance of the magnetic bubble stretcher by means of bubble propagation patterns having a proper configuration and to form the rectangular bubble propagation part 5 by means of bubble propagation patterns having another proper configuration. It is also desirable from the practical point of view to make the bias field margin not smaller than 10 percent. Therefore, as can be seen from FIG. 7a, it is especially preferable that the width of each bubble propagation pattern included in the fanlike bubble fanning part 4 is 0.8 to 2 times the bubble diameter. In this case it is desirable that the bubble propagation pattern has three or more winding points at its central portion.

Now, embodiments of the present invention will be explained below.

Figure 8:
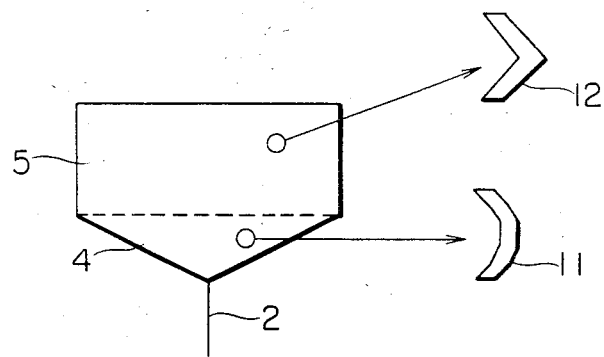
FIGS. 8 and 9 are schematic views showing different embodiments of a magnetic bubble stretcher according to the present invention.

FIG. 8 shows the structure of an embodiment of a magnetic bubble stretcher according to the present invention. In the present embodiment, a fanlike bubble fanning part 4 for stretching a bubble is formed of bubble propagation patterns 11 each of which has several (three or more) winding points at its central portion as shown in FIG. 6, to prevent an error in the bubble stretching operation. The maximum width of the bubble propagation pattern 11 in a direction perpendicular to the bubble propagation direction is 0.8 to 2 times the diameter of the bubble. On the other hand, a rectangular bubble propagation part 5 adjoining to the bubble fanning part 4 is formed of chevron-shaped bubble propagation patterns 12 each of which has one winding point or two sides capable of sufficiently stretching the bubble. The present embodiment having such a structure can operate in a wide range of bias magnetic field.

Figure 9:
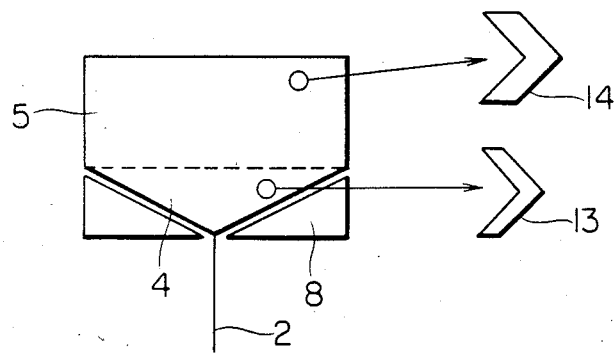

FIG. 9 shows another embodiment of a magnetic bubble stretcher according to the present invention. In this embodiment, a pair of triangular dummy bubble fanning parts 8 are provided in addition to a fanlike bubble fanning part 4 and a rectangular bubble propagation part 5. The fanlike part 4 and the triangular parts 8 provide a rectangular form as a whole. All of bubble propagation patterns making up the magnetic bubble stretcher have the form of a chevron with two sides or one winding point. The bubble propagation patterns 13 included in the bubble fanning part 4 and dummy bubble fanning parts 8 disposed at the entrance of the embodiment have the same periodicity in the bubble propagation direction) as the bubble propagation patterns 14 but a different width (in a direction perpendicular to the bubble propagation direction) from the width of the bubble propagation patterns 14 included in the rectangular bubble propagation part 5. In more detail, the maximum width of each bubble propagation pattern 13 included in the bubble fanning part 4 and the dummy parts 8 is equal to the width w of the strip domain while the maximum width of each bubble propagation pattern 14 included in the bubble propagation part 5 is 1.7 times as long as the width w of the strip domain. That is, the width of bubble propagation pattern is optimized in each of the bubble fanning part 4 and the bubble propagation part 5 so that these parts 4 and 5 can show good characteristics.

In the present embodiment, the bubble propagation patterns have been arranged to have the same periodicity in all the parts 4, 5 and 8. However, it is preferred to optimize the periodicity in each of these parts. In this case, the periodicity of bubble propagation patterns in the fanlike bubble fanning part 4 is preferably smaller than that of bubble propagation patterns is the rectangular bubble propagation part 5.

As is evident from the foregoing explanation, the present invention can provide a magnetic bubble stretcher which can eliminate an error associated with the stretching of a bubble under a low bias magnetic field, thereby providing a sufficiently wide bias field margin.

We claim:

1. A magnetic bubble stretcher comprising a bubble fanning part for propagating a magnetic bubble while gradually stretching the bubble and a bubble propagation part for propagating the stretched bubble, wherein each of bubble propagation patterns included in said bubble fanning part is shaped to have substantially at least three winding points and each of bubble propagation patterns included in said bubble propagation part is shaped to have substantially one winding point.

2. A magnetic bubble stretcher according to claim 1, wherein the bubble propagation patterns in said bubble fanning part are disposed to form a fanlike arrangement and the bubble propagation patterns in said bubble propagation part are disposed to form a rectangular arrangement.

3. A magnetic bubble stretcher according to claim 2, wherein the maximum width of each bubble propagation pattern in said bubble fanning part in a direction perpendicular to a bubble propagation direction is 0.8 to 2 times the diameter of the magnetic bubble.

4. A magnetic bubble stretcher according to claim 1, wherein the maximum width of each bubble propagation pattern in said bubble fanning part in a direction perpendicular to a bubble propagation direction is 0.8 to 2 times the diameter of the magnetic bubble.

5. A magnetic bubble stretcher according to claim 1, wherein the bubble propagation patterns in said bubble fanning part are arranged with its periodicity in a bubble propagatoin direction being smaller that that of the periodicity of the bubble propagation patterns in said bubble propagation part.

6. A magnetic bubble stretcher comprising a bubble fanning part for propagating a magnetic bubble while gradually stretching the bubble and a bubble propagation part for propagating the stretched bubble, each of bubble propagation patterns included in said bubble fanning and propagation parts being shaped to have substantially one widing point, and the maximum width of each bubble propagation pattern in said bubble propagation part in a direction perpendicular to a bubble propagation direction being larger than the maximum width of each bubble propagation pattern in said bubble fanning part in a direction perpendicular to the bubble propagation direction.

7. A magnetic bubble stretcher according to claim 6, wherein said bubble propagation patterns in said bubble fanning part are arranged with its periodicity in the bubble propagation direction being smaller that the periodicity of said bubble propagation patterns in said bubble propagation part.

8. A magnetic bubble stretcher according to claim 6, wherein the bubble propagation patterns in said bubble propagation part are disposed to form a rectangular arrangement, the bubble propagation patterns in said bubble fanning part being disposed to form a fan-like arrangement, and further comprising dummy bubble propagation patterns disposed adjacent to said bubble fanning parts, each of said dummy bubble propagation patterns being shaped to have substantially one winding point.

9. A magnetic bubble stretcher according to claim 8, wherein said dummy bubble propagation patterns are arranged to form a pair of triangular dummy parts so that said bubble fanning part of said fan-like arrangement and said pair of triangular dummy parts provide a rectangular form as a whole.

10. A magnetic bubble stretcher according to claim 9, wherein the maximum width of each of said dummy bubble propagation patterns in said dummy parts in a direction perpendicular to the bubble propagation direction is substantially the same as that of the maximum width of each of the bubble propagation patterns in said bubble fanning part in a direction perpendicular to the bubble propagation direction.

* * * * *